US006760880B1

(12) United States Patent
Ofek et al.

(10) Patent No.: US 6,760,880 B1
(45) Date of Patent: Jul. 6, 2004

(54) SCALAR PRODUCT AND PARITY CHECK

(75) Inventors: Eli Ofek, Hod Hasharon (IL); Osnat Keren, Rosh Ha'ayin (IL)

(73) Assignee: Ceva D.S.P. Ltd., Herzlia Pituach (IL)

( * ) Notice: Subject to any disclaimer, the term of this patent is extended or adjusted under 35 U.S.C. 154(b) by 0 days.

(21) Appl. No.: 09/391,363

(22) Filed: Sep. 8, 1999

Related U.S. Application Data

(60) Provisional application No. 60/099,700, filed on Sep. 10, 1998.

(51) Int. Cl.[7] .............................................. H03M 13/00
(52) U.S. Cl. ...................................................... 714/758
(58) Field of Search ................................. 714/758, 800, 714/786, 819, 724; 712/20; 340/146.2; 708/422–426, 671

(56) References Cited

U.S. PATENT DOCUMENTS

| | | | | |
|---|---|---|---|---|
| 4,313,160 A | * | 1/1982 | Kaufman et al. | |
| 4,430,737 A | | 2/1984 | Beranger et al. | |
| 4,617,625 A | * | 10/1986 | Nagashima et al. | |
| 4,626,711 A | | 12/1986 | Li | |
| 4,811,344 A | * | 3/1989 | Chauvel et al. | |
| 4,996,689 A | * | 2/1991 | Samad | |
| 5,040,179 A | * | 8/1991 | Chen | |
| 5,155,387 A | | 10/1992 | Fletcher et al. | |
| 5,523,707 A | | 6/1996 | Levy et al. | |
| 5,548,665 A | * | 8/1996 | Gion et al. | |
| 5,550,766 A | * | 8/1996 | Al-Zamil | |
| 5,778,241 A | * | 7/1998 | Bindloss et al. | ............... 712/20 |
| 5,894,487 A | * | 4/1999 | Levitan | |
| 5,954,836 A | * | 9/1999 | Wang | .......................... 714/786 |
| 6,330,702 B1 | * | 12/2001 | King | |

OTHER PUBLICATIONS

Janusz Rajski et al "Test Data Decompression for Multiple Scan Designs With Boundary Scan" IEEE Transactions on Computers, vol. 47, No. 11, Nov. 1998.*

* cited by examiner

Primary Examiner—Phung M. Chung
(74) Attorney, Agent, or Firm—Eitan, Pearl, Latzer & Cohen, Zedek, LLP

(57) ABSTRACT

An apparatus includes a plurality of AND gates each to receive as input a bit of a first binary vector and a corresponding bit of a second binary vector, where the length of the first binary vector is not greater than the length of the second binary vector. The apparatus also includes a multiple input XOR gate to calculate in a single cycle a scalar product of the first binary vector and the second binary vector by performing an exclusive OR operation on the output of each of the AND gates.

6 Claims, 3 Drawing Sheets

SCALAR PRODUCT AND PARITY CHECK

This Application claims benefit of provisional App. 60/099,700 filed Sep. 10, 1998.

FIELD OF THE INVENTION

The present invention relater-to met hods and apparatus for calculating scalar products over Galois Field (GF2) in general, and for calculating a parity check of a binary vector, in particular, These scalar operations are employable in communication systems which employ coding techniques (e.g. block codes or convolutional coder) and synchronizaton mechanisms.

BACKGROUND OF THE INVENTION

A scalar product of two binary vectors over GF2 plays a crucial part in a variety of applications. such as error correcting codes, codes for synchronization, parity check, binary convolution and multiplication of polynomials over GF2.

A scalar product is defined as follows;

Let $A=(a_1, a_2, \ldots a_n)$ and $B-(b_1, b_2, \ldots b_n)$, where both A and B are binary vectors of length n.

Therefore, the resultant scalar product is: $Z=(A,B)_2$ $$Z = (A, B)_2 = \left(\sum_{i=1}^{n} a_i b_1\right) \bmod 2$$

mod2 where Z is the parity check of selected columns of binary vector A, and where binary vector B is used as a mask defining the selected columns. Where the binary code of B is defined as 0, the associated binary code of A is masked, and a parity check is not calculated. Where the binary code of B is defined as 1, a parity check of the associated binary code of A is calculated. As such, when B is defined as an all-ones vector, parity of the entire vector A is computed.

SUMMARY OF THE PRESENT INVENTION

It is an object of the present invention to provide a mechanism that computes a scalar product (SP) of two binary vectors of length n<=SIZE within one cycle, where n is the length of a first binary vector and SIZE is the length of a second binary vector. Typically, the second binary vector is a word of either 16, 20, 24, 32, 40. 48 or 56 bits, or any other length less than 56 bits.

Furthermore, if n>SIZE<2*SIZE then it is possible to perform the scalar product within 2 cycles by activating a special include zero switch. It is additionally noted that if n>2*SIZE, the scalar product is performed within $$\left[\frac{n}{SIZE}\right] \times 3/2 \text{ cycles,}$$

where $$\left[\frac{n}{SIZE}\right]$$

is a minimal integer equal to or greater than $$\frac{n}{SIZE}.$$

Furthermore, in several applications, such as convolutional codes or cyclic linear block codes, the information is represented as a polynomial of degree n>>SIZE.

The encoder generates the encoded data by multiplying it with generating polynomials of degree less or equal to SIZE. The present invention supports this computation with complexity of n cycles per generating polynomial, A typical CPU supports bit by bit multiple input XOR operation, therefore, it takes n cycles to check the parity of a vector of length n. To overcome this drawback, in several applications external hardware is added. Another approach, for example in convolutional codes, is to implement the encoder as state machine.

There is therefore provided in a preferred embodiment of the present invention, a multiple input XOR for determining the parity of a vector.

There is additionally provided an apparatus for determining the parity of a vector, The apparatus includes a storage unit for storing an input vector of length N and a multiple input XOR for determining the parity of M bits of the input vector and for generating a parity bit. Alternatively, the apparatus further includes means for providing the bits of the input vector and the parity bit to the XOR, such that the parity of the entire input vector is determined.

Preferably the apparatus also includes means for generating an activation means, or switch, which considers the value of the parity bit, and dependent therefrom, activates conditional instructions. The apparatus may also includes an accumulator for storing a second vector and an input carry means. The input carry means, upon receipt of the parity bit, inputs the most significant bit from the accumulator into the least significant bit of the storage unit.

Preferably the apparatus further includes shift means for shifting the input vector one bit, within the storage unit, upon receipt of the most significant bit. In addition, preferably all of the means operate independently.

BRIEF DESCRIPTION OF THE DRAWINGS

The present invention Will be understood and appreciated more fully from the following detailed description taken in conjunction with the drawings in which.

DETAILED DESCRIPTION OF PREFERRED EMBODIMENTS

Figure 1A:
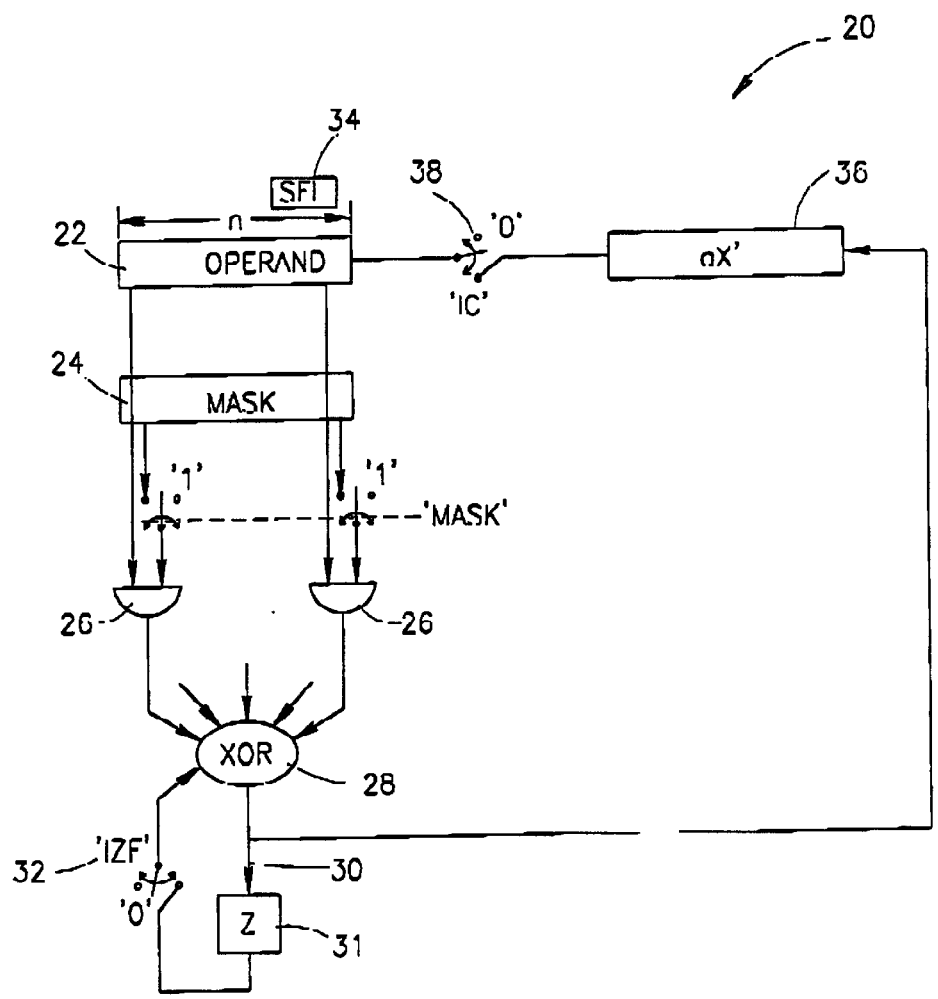
FIGS. 1A and 1B are examples of a party model constructed and operative in accordance with a preferred embodiment of the present invention.
Figure 1B:
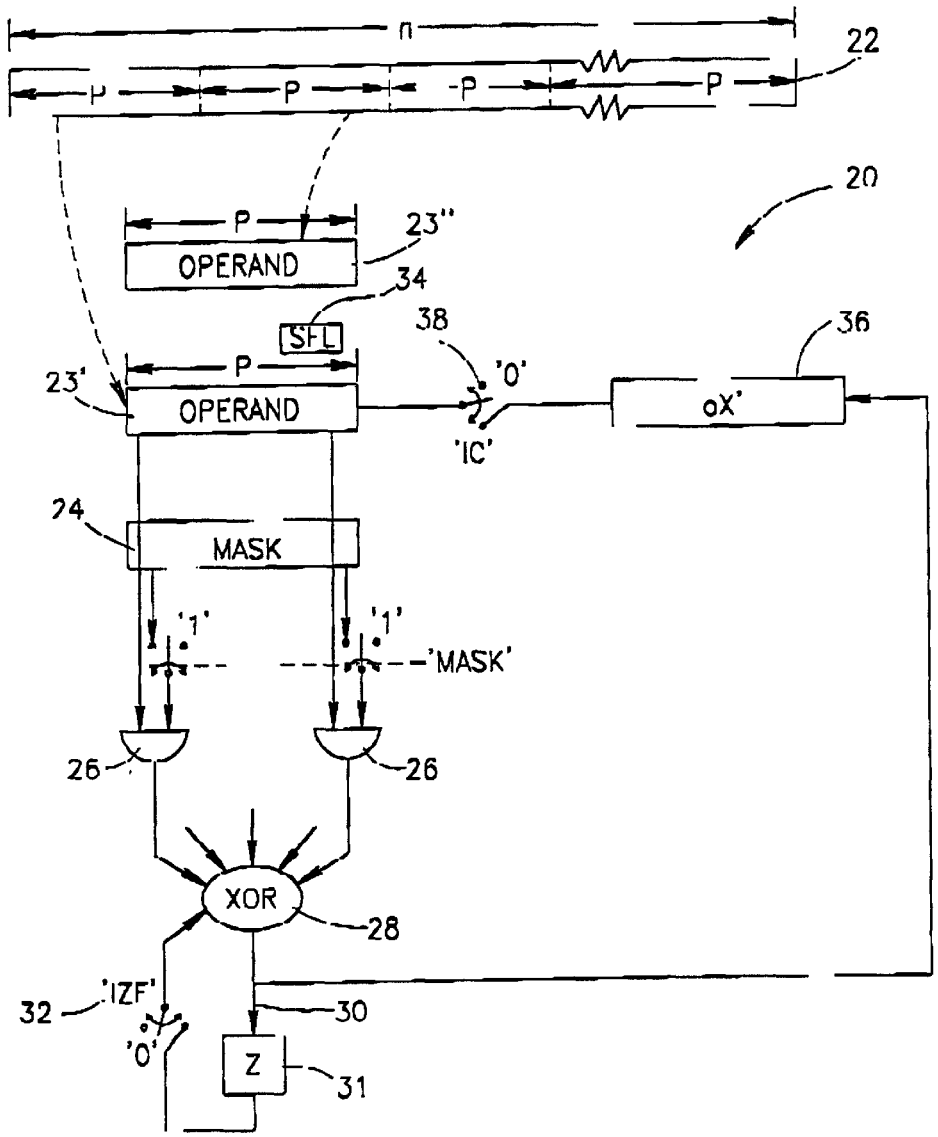

Reference, is now made to FIGS. 1A and 1B which illustrate a parity model 20, constructed and operative in accordance with a preferred embodiment of the present invention.

Model 20 calculates a scalar product, generally a parity check, within one cycle, on a first and a second binary vectors of length n<=SIZE, where n is the length of the first vector and SIZE is the length of the second vector . Typically, SIZE is the length of a word, either 16, 20, 24, 32, 40, 48 or 56 bits, or any length less than 56 bits. In a preferred embodiment, the parity check is performed utilizing an exclusive OR (XOR) gate.

In an alternative preferred embodiment of the present invention, model 20 further includes zero flag, which upon notification of parity, activates a series of conditional instructions.

Additionally, in instances where the first binary vector is of a length n where SIZE<n<2⁺SIZE, model 20 performs the scalar product within 2 cycles by, activating a special switch. Furthermore, in instances where the first binary vector is of a length n where n>2*SIZE, model 20 performs the scalar product within $$\left[\frac{n}{SIZE}\right] \times 3/2 \text{ cycles.}$$

In a preferred embodiment of the present invention, model 20 comprises a multiplicity of AND gates 26, an exclusive OR (XOR) gate 28 and a storage cell 31. Model 20 performs scalar operation on an operand vector 22, optionally with a mask vector 24.

Operand vector 22 is a binary vector, for example, commonly a 16 bit word or a 32 bit double word. Mask vector 24 is a mask vector, for example, commonly of 16 or 32 bits. Unless otherwise defined, the default mask vector 24 is an all-ones vector. AND gates 26 support a common logical operation known in the art.

In a preferred embodiment of the present invention, XOR gate 28 is a multiple input XOR gate which receives the outputs of AND gates 26 plus another input, such as the parity bit. Multiple input XOR gate 28 is a collection of two or more XOR gates concatenated together.

Generally, each bit in vector 24 is associated with an associated bit in vector 22. Commonly the two vectors 22 and 24 are aligned such that lowest significant bit (LSD) of vector 24 is associated with the LSB of vector 22, and so on for the length of the two vectors 22 and 24.

Cell 31 is preferably defined as the zero flag and stores the scalar product of the XOR gate 28. In some preferred embodiments, cell 31 stores the parity bit.

Model 20 additionally comprises an include zero switch 32, a shift left by one switch 34, and an input carry switch 38. Each switch is activated independently of the other switches and independently of the other logical operations performed by model 20. The activation or non-activation of the switches is specified during definition of the parity check. Appendix A explains in more details switch definition and activation.

Model 20 furthermore comprises an accumulator 36 which stores a vector aX'. Activation or non-activation of accumulator 36 is specified during the instructions defining the scalar operation. In alternative embodiments, model 20 comprises one or more accumulators 36 and associated vectors aX'.

The include zero switch 32 determines whether or not to pass through the parity bit, a variable 30, to XOR gate 28. Typically, when include zero switch 32 is 0, the parity bit is not passed through to XOR gate 32, and when the switch 32 is 1, the parity bit is passed through.

The operation of the include zero switch 32 is defined by:

Z=<operand, mask>⊕ izf·Z, where ⊕ is defined as XOR gate 28, Z is defined as the bit stored in cell 31, and izf is defined as include zero switch 32.

The accumulator 36 operation is defined as:

aX'=(aX<<1)+cell 31, where shift left by 1 position is denoted as<<1.

In a preferred embodiment, vector aX' is the operand remainder of vector 22.

In an alternative preferred embodiment, when the appropriate switches are designated, vector aX' includes the scalar products of convolution operations. In further alternative embodiments, vector aX' includes both the operand remainder and convolution scalar products. In such instances, preferably the operand remainder is stored in the most significant bits (MSB) of vector aX' and the scalar products are stored in the LSB.

When the accumulator 36 is specified, the vector stored in accumulator 36 shifts left by one position. The parity bit, variable 30, is carried into the LSB of the accumulator 36, and the MSB of accumulator 36 is carried out When input carry switch 38 is turned on, the MSB of the vector aX' in carried out of accumulator 36 and carried-in to the LSB of vector 22. Otherwise, the carry-out bit of accumulator 36 is not used, and the carry-in bit (LSB) of vector 22 is set to zero.

The operation of the shift left switch 34 is defined as:

operand=(operand<<sfl)+Ic. MSB (aX').

where operand is defined as the vector 22, <<sfl is defined as the shift left switch 34, Ic is defined as input carry switch 38 and aX is defined as the vector stored in accumulator 36.

When the shift left switch 34 is activated, the operand vector 22 shifts one place to the left in respect to mask vector 24, and allowing a carry-in to the LSB of operand vector 22.

Typically, shifting to the left, for all elements, is equivalent to shifting to a more significant bit.

Binary Vectors of Length n<=SIZE

In an exemplary model, the associated bits from operand vector 22 and mask vector 24 are received by the AND gates 26. The AND gates 26 output the masked scalar products of the two vectors 22 and 24. As an example, when the bit in mask vector 24 is 1, the associated bit from operand vector 22 is allowed to pass through the AND gate 26. In contrast, when the bit in mask vector 24 is 0, the associated bit from operand vector 22 is masked, and not allowed to pass through the AND gate 26.

In alternative embodiments, model 20 does not utilize mask vector 24. As such, the bits of vector 22 is received by the AND gates 26 without masking.

XOR gate 28 receives the outputs of the AND gates 26 and performs an exclusive OR, an XOR, producing one bit parity bit variable 30. Variable 30, either 1 or 0, signifies non-parity or parity, respectively, and is stored in memory cell 31. In alternative embodiments, cell 31 is used as a zero flag, wherein the parity bit variable 30 is considered and conditional therefrom, operations such as branching are performed. Alternatively, in a preferred conditional embodiment, the parity bit variable 30 is delivered from cell 31 to XOR gate 28, thus allowing model 20 to calculate the parity of the entire vector 22.

Binary Vectors of Length n>SIZE

In an alternative preferred embodiment of model 20, the operand vector 22 is length n where n is greater than SIZE (n>SIZE). Accordingly, model 20 comprises optional switches which provide for operand vector 22 to be successively shifted left by one bit, respective to operand vector 24, providing for operations such as convolution.

Alternatively, model 20 performs parity operations on vectors of length n>SIZE, where n is greater than two times SIZE (n>2*SIZE). In these preferred embodiments, model 20 incorporates an initialization cycle wherein vector 22 is divided into a plurality of vector, generally designated as 23, of length p, where p<=SIZE.

Preferably, during the initialization cycle model 20 prepares two vectors of length p<=SIZE, a vector 23' and a vector 23". First the parity check is performed on vector 23', then on vector 23". Successive initialization cycles are performed, wherein in each cycle two vectors 23 of length p<=SIZE are prepared, and then presented for parity check. The successive cycles are repeated until the entire vector 22 has been divided and checked for parity.

Hence, for instances where n>2*SIZE, model 20 performs the scalar product within $$\left[\frac{n}{SIZE}\right] \times 3/2 \text{ cycles.}$$

Convolution Operations with Binary Vectors of Length n>SIZE

Herein illustrated in FIG. 1A, is an exemplary convolution operation when all the switches and the accumulator 36 are activated. The cycle commences with vectors 22 and 24 being received by AND gates 26. Then the outputs of AND gates 26 and the parity bit are received by XOR gate 28. For the first cycle of the convolution operation, XOR gate 28 receives a default parity bit, which is preferably a 0.

XOR gate 28 outputs parity bit variable 30 which is stored in cell 31 and in parallel also sent to accumulator 36. Switch 32 considers the parity bit variable 30, and either passes the parity bit to the XOR gate 28 or not, depending on its value (either 1 or 0, respectively).

Concurrently the parity bit variable 30 is entered into the LSB of accumulator 36, which shifts vector aX' left by one bit. The input carry switch 38 then causes the MSB of vector ax' to be carried-out of the accumulator 36 and carried-in to the LSB of the vector 22. Shift left switch 34 shifts vector 22 left by one bit, thus allowing the carry-in bit to be received and stored in the LSB of vector 22.

The cycle is complete, and a successive cycle commences. The shifted vector 22 and vector 24 are received by AND gates 26. The output of AND gates 26, along with the parity bit variable 30 as output by switch 32 in the previous cycle, are received by XOR gate 28. The cycle continues, along with successive cycles, until all the bits in vector 22 have undergone the convolution operation.

Parity Operations with Binary Vectors of Length n>2*SIZE

Herein illustrated in FIG. 11, is an exemplary parity operation performed on vector 22 of a length n>2*SIZE. In the initialization cycle, model 20 divides vector 22 into multiple vector 23, each vector 23 having a length p<=SIZE. Preferably, in each initialization cycle two vectors 23 are prepared. For purposes of clarity, FIG. 1B illustrates two vectors 23, labeled vector 23' and 23", respectively. It is however noted that for vectors 22 of length n>2*SIZE, vector 22 is dividable into a multitude of vectors 23 of lengths p>=SIZE.

Vector 23' is presented to vector 24. Bits from both vectors are received by AND gates 26. A parity check operation similar to that described in detail herein above in reference to n<=SIZE is performed. Upon completion of the cycle, model 20 removes vector 23', and presents vector 23" to vector 24. The cycle is repeated, utilizing as an input to XOR gate 28 the parity bit 30 produced in the previous cycle. Upon completion of the parity performed on vector 23", vector 23" is removed. The parity bit variable 30 produced in this cycle is utilized in the next cycle as an input to XOR gate 28.

Model 20 re-accesses vector 22 and further segments out two more vectors 23' and 23" of length p<=SIZE. The parity operations explained hereinabove are repeated, until the entire vector 22 has been checked for parity. It is noted that the parity bit variable 30 is constantly being recycled into XOR gate 28, thus allowing model 20 to perform a parity check on the entire vector 22, regardless of the number of operation cycles performed.

Instructions

Model 20 supports two instructions, parity operand [,sfl [,IC]] [,mask] [,izf] [,aX']

paritydw operand [,sfl [,IC]] [,mask] [,izf] [,aX']

Both of these instructions are described in Appendix A. In a preferred embodiment, the user must specify the vector 22 other variables (written as [var]) are optional, with the defaults being;

vector 24=all-ones, sfl switch 34=OFF, ic switch 38=OFF, izf switch 32=OFF, aX' accumulator 36=NULL.

EXAMPLES

Block Codes—Parity Check for Syndrome Computation

Consider a binary linear block code [n,k,d] of length n, having k information bits and minimum distance d. Assume that the code is defined by its parity check matrix H of size (r x n). Namely, a binary vector, say $c=(c_1, o_2, \ldots c_n)$ is a codeword and only If $s=H \cdot c^T=0$. The resulting vector $s=(s_1, \ldots s_n)$ is called the syndrome, which indicates whether or not an error occurred during the transmission. The present invention enables an efficient and simple way to compute the syndrome.

For example syndrome computation of Hamming code [cell 31,26,3] takes exactly 5 cycles, when the received word plays the role of the mask and the 5 rows of the parity check matrix are the operands.

For longer (n>32) Hamming codes [$n=2^m-1, k=2^m-1-m, d=3$] the syndrome computation requires exactly $$m\left[\frac{2^m-1}{32}\right] \text{ cycles.}$$

Polynomial Multiplication Over GF2

Cyclic codes are subclass of linear block codes. They are popular due to their simple encoding and decoding techniques. Indeed their coding procedures require polynomial multiplication over GF2. This is equivalent to performing a convolution of the polynomials coefficients. Namely, let $$A(x) = \sum_{i=0}^{s} a_i x^i \text{ and } B(x) = \sum_{i=0}^{s} b_i x^i,$$

s<t, two binary polynomials, then $$C(x) = A(x)B(x) = \sum_{i=0}^{s+t} c_i x^i,$$

where the coefficient $$c_i = \sum_{k=0}^{min(i,s)} a_{ki} b_{il-k}$$

If s<=SIZE then it is possible to compute C(x) within s+t cycles (one cycle per coefficient), where A(x) plays the role of the mask and the switches are Set as follows ic=ON, sfl=ON and izf=OFF More important, each coefficient is computed separately. So it is possible to compute only selected coefficients.

Convolution Codes

Figure 2:
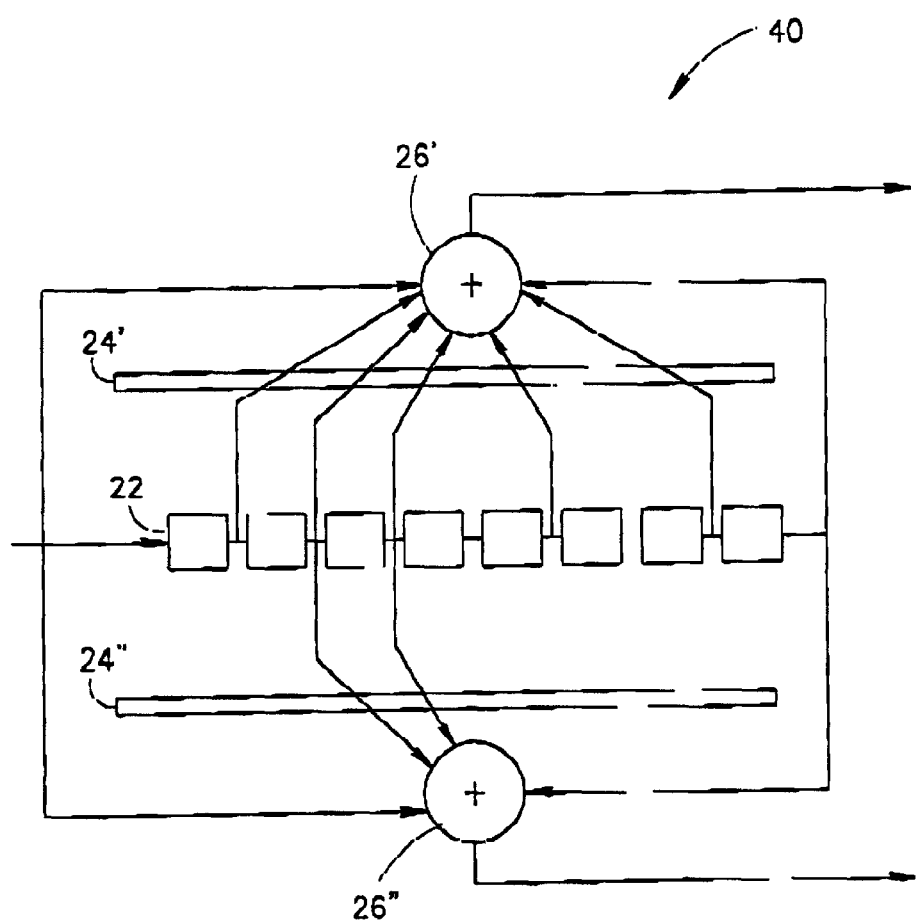
FIG. 2 is an illustration of a convolutional encoder which is supported by the parity model illustrated in FIGS. 1A and 1B.

Please refer to FIG. 2 for an example of a convolutional encoder 40 which supports 20. Elements similar to FIG. 1 are similarly referenced and will not be described further.

A first bit segment of vector 22 is received by encoder 40. Two mask vectors 24' and 24" are presented to vector 22.

Vector 22 and vector 24' are received by AND gates 26'. Relatively simultaneously vector 22 and vector 24" are presented to AND gates 26". Encoding operations known in the art are performed, and the next bit segment of vector 22 is received by encoder 40. The encoding operations are repeated until the entire vector 22 has been encoded.

It will be appreciated by persons skill in the art that the present invention is not limited to what has been particularly shown and described hereinabove. Rather the scope of the present invention is defined only by the claims which follow:

What is claimed is:

1. Apparatus comprising:

a storage unit to store an input vector;

a multiple input XOR gate to perform an exclusive OR operation on bits of said input vector, thus generating an output bit;

an accumulator to store an additional vector; and an accumulator updating means, which receives said output bit and inputs said output bit into the least significant bit of said accumulator, shifts said additional vector one bit within said accumulator, and outputs the most significant bit of said accumulator.

2. The apparatus of claim 1, further comprising an input carry means, which upon receipt of said most significant bit inputs said most significant bit into the least significant bit of said storage unit.

3. The apparatus of claim 2, further comprising shift means for shifting said input vector by one bit within said storage unit upon receipt of said most significant bit.

4. Apparatus for determining the parity of a vector, the apparatus comprising:

a storage unit to store an input vector;

a multiple input XOR gate to perform an exclusive OR operation on bits of said input vector thus generating an output bit;

means for providing said output bit to said XOR gate;

means for holding said output bit for consideration by an activation means, wherein said activation means activates conditional instructions dependent therefrom;

an accumulator to store an additional vector;

an accumulator updating means, which receives said output bit and inputs said output bit into the least significant bit of said accumulator, shifts said additional vector one bit within said accumulator, and outputs the most significant bit of said accumulator;

an input carry means, which upon receipt of said most significant bit inputs said most significant bit into the least significant bit of said storage unit; and shift means for shifting said input vector by one bit within said storage unit upon receipt of said most significant bit, wherein each of said means operates independently.

5. An apparatus comprising:

a first storage unit to store a first portion of an operand binary vector;

an accumulator to store a second portion of said operand binary vector;

an input carry switch to determine whether the most significant bit of said accumulator is carried into the least significant bit of said first storage unit;

a shift left switch to determine whether to shift said first storage unit one bit to the left;

a second storage unit to store a mask binary vector whose length is less than the length of said operand binary vector;

a plurality of AND gates each to receive as input a bit of said first portion and a corresponding bit of said mask binary vector; and a multiple input XOR gate to generate an output bit by performing in a single cycle an exclusive OR operation on the output of each of said AND gates and, subject to an include zero switch, on said output bit, said XOR gate able to pass said output bit to the least significant bit of said accumulator.

6. An apparatus comprising:

a first storage unit to store an operand binary vector;

a second storage unit to store a mask binary vector whose length is less than half the length of said operand binary vector;

a plurality of AND gates each to receive as input a bit of a portion of said operand binary vector and a corresponding bit of said mask binary vector, the length of said portion being less than the length of said mask binary vector; and a multiple input XOR gate to generate an original output bit by performing in a single cycle an exclusive OR operation on the output of each of said AND gates and, when a subsequent portion of said operand binary vector is input to said AND gates, to generate an updated output bit by performing in a single cycle an exclusive OR operation on the output of each of said AND gates and on said original output bit.

* * * * *

UNITED STATES PATENT AND TRADEMARK OFFICE
CERTIFICATE OF CORRECTION

PATENT NO. : 6,760,880 B1
DATED : July 6, 2004
INVENTOR(S) : Ofek, Eli et al.

It is certified that error appears in the above-identified patent and that said Letters Patent is hereby corrected as shown below:

Title page,
Item [74], *Attorney, Agent or Firm*, please delete "*Attorney, Agent or Firm* - Eitan Pearl, Latzer & Cohen, Zedek, LLP" and insert in lieu thereof -- *Attorney, Agent or Firm* - Eitan, Pearl, Latzer & Cohen Zedek, LLP --

Signed and Sealed this

Thirty-first Day of August, 2004

JON W. DUDAS
*Director of the United States Patent and Trademark Office*